(12) United States Patent
Polakowski et al.

(10) Patent No.: US 11,398,568 B2
(45) Date of Patent: Jul. 26, 2022

(54) FERROELECTRIC BASED TRANSISTORS

(71) Applicant: GLOBALFOUNDRIES Dresden Module One Limited Liability Company & Co. KG, Dresden (DE)

(72) Inventors: Patrick Polakowski, Dresden (DE); Konrad Seidel, Dresden (DE); Tarek Ali, Dresden (DE)

(73) Assignee: GLOBALFOUNDRIES DRESDEN MODULE ONE LIMITED LIABILITY COMPANY & CO. KG, Dresden (DE)

( * ) Notice: Subject to any disclaimer, the term of this patent is extended or adjusted under 35 U.S.C. 154(b) by 0 days.

(21) Appl. No.: 16/904,257

(22) Filed: Jun. 17, 2020

(65) Prior Publication Data
US 2021/0399135 A1 Dec. 23, 2021

(51) Int. Cl.
*H01L 29/78* (2006.01)
*H01L 27/11507* (2017.01)
(Continued)

(52) U.S. Cl.
CPC .. *H01L 29/78391* (2014.09); *H01L 27/10829* (2013.01); *H01L 27/10832* (2013.01); *H01L 27/11507* (2013.01); *H01L 29/40111* (2019.08)

(58) Field of Classification Search
CPC .......... H01L 27/1082; H01L 27/10829; H01L 27/10832; H01L 27/11502;
(Continued)

(56) References Cited

U.S. PATENT DOCUMENTS 6,015,990 A * 1/2000 Hieda ............... H01L 27/10858
257/295
6,165,837 A * 12/2000 Kawakubo ........ H01L 27/10858
257/E21.654
(Continued)

FOREIGN PATENT DOCUMENTS

JP 2004516687 A * 6/2004 ........ H01L 27/11502

OTHER PUBLICATIONS

J. Muller et al., "High endurance strategies for hafnium oxide based ferroelectric field effect transistor," 2016 16th Non-Volatile Memory Technology Symposium (NVMTS), Pittsburgh, PA, 2016, pp. 1-7, 7 pages.
(Continued)

*Primary Examiner* — Matthew E Warren
(74) *Attorney, Agent, or Firm* — David Cain; Andrew M. Calderon; Roberts Calderon Safran & Cole, P.C.

(57) ABSTRACT

The present disclosure relates to semiconductor structures and, more particularly, to ferroelectric based transistors and methods of manufacture. The ferroelectric based transistor includes: a semiconductor-on-insulator substrate including a semiconductor material, a buried insulator layer under the semiconductor material and a substrate material under the semiconductor channel material; a ferroelectric capacitor under the buried insulator layer and which includes a bottom electrode, a top electrode and a ferroelectric material between the bottom electrode and the top electrode; a gate stack over the semiconductor material; a first terminal contact connecting to the bottom electrode of the ferroelectric capacitor; and a second terminal contact connecting to the top electrode of the ferroelectric capacitor.

20 Claims, 8 Drawing Sheets

(51) Int. Cl.
*H01L 21/28* (2006.01)
*H01L 27/108* (2006.01)

(58) Field of Classification Search
CPC ......... H01L 27/11507; H01L 27/11584; H01L 29/40111; H01L 29/78391
See application file for complete search history.

(56) References Cited

U.S. PATENT DOCUMENTS

| | | | |
|---|---|---|---|
| 6,225,646 B1* | 5/2001 | Gardner | H01L 21/84 257/374 |
| 6,242,298 B1* | 6/2001 | Kawakubo | H01L 21/31691 257/E21.664 |
| 10,176,859 B2 | 1/2019 | Duenkel et al. | |
| 2020/0243549 A1* | 7/2020 | Jiang | G11C 11/22 |

OTHER PUBLICATIONS

T. Ali et al., "High Endurance Ferroelectric Hafnium Oxide-Based FeFET Memory Without Retention Penalty," in IEEE Transactions on Electron Devices, vol. 65, No. 9, pp. 3769-3774, Sep. 2018, 6 pages.

K. Ni et al., "Write Disturb in Ferroelectric FETs and Its Implication for 1T-FeFET and Memory Arrays," in IEEE Electron Device Letters, vol. 39, No. 11, pp. 1656-1659, Nov. 2018, 4 pages.

T. Ali et al., "Silicon doped hafnium oxide (HSO) and hafnium zirconium oxide (HZO) based FeFET: A material relation to device physics" Applied Physics Letters 112, 222903 (2018), 6 pages.

\* cited by examiner

FERROELECTRIC BASED TRANSISTORS

FIELD OF THE INVENTION

The present disclosure relates to semiconductor structures and, more particularly, to ferroelectric based transistors and methods of manufacture.

BACKGROUND

A ferroelectric field effect transistor (FeFET) gate stack structure is characterized by ferroelectric (FE) material integration, where a buffer interfacial layer is grown between the ferroelectric material layer and the Si substrate. The buffer interfacial layer has an intrinsically lower permittivity compared to the ferroelectric material, thereby changing the gate stack field distribution toward an increased field at the buffer interfacial layer and reduced field across the ferroelectric material. As a consequence, the FeFET operation range is shifted toward higher write conditions and accompanied with severe charge injection and trapping in the ferroelectric material layer resulting in a limited endurance of the memory. The endurance and write conditions are among key challenges for FeFET to achieve a universal memory characteristic.

The FeFET memory window (MW) is defined as the difference in $V_T$ shift of erase and program $I_d$-$V_g$ readout. The memory window size is a result of the direct relationship between memory window and thickness of the ferroelectric material layer (MW~$2E_c*d_F$) based on the FeFET gate stack derivations. Hence, considering constant $E_c$, this relation resembles a fundamental physics limit for the maximum achievable memory window thereby hindering the FeFET being used as multi-bit storage memory and limiting the gate stack scalability beyond a thickness range where the memory window is optimum.

Moreover, the FeFET readout operation is achieved by sweeping the gate voltage ($V_g$) while measuring the drain-source current. As the ferroelectric material layer integrated into the FeFET gate stack is subjected to the same readout voltage, the readout operation, for certain conditions of ferroelectric material thickness and $V_g$ range, can result in altering the ferroelectric material state. The readout disturb becomes more challenging for FeFETs based on the scaled thickness of the ferroelectric material layer.

The common FRAM type memory features ferroelectric material capacitor integration in the back end of line (BEOL), where the ferroelectric material capacitor is connected to the drain terminal of the front end of line (FEOL) logic device. The integration of the ferroelectric material capacitor in BEOL limits the maximum practical capacitor size and hence the obtained remnant polarization $P_r$. A maximized $P_r$ value becomes crucial toward a high sense current in order to relax the design aspects of the sense amplifiers.

The low write operation of FeFET is achieved by utilizing a relatively higher permittivity buffer interfacial layer to decrease the voltage across the buffer interfacial layer in favor of increased voltage across the ferroelectric material FeFET. In turn, this leads to improved endurance characteristics of the FeFET. However, endurance and write voltage improvements are still far from fulfilling specification for main application domains e.g., embedded memories, and could limit the FeFET to niche applications.

The attempt to enlarge the FeFET memory window through increasing the ferroelectric material layer thickness is challenged by the decrease in the ferroelectric material properties upon increased thickness due to premature film crystallization during deposition thereby deviating from a stabilized orthorhombic phase. The ferroelectric material property is more pronounced for scaled film thickness and hence the attempt to increase the ferroelectric material layer thickness results in an increased fraction of stabilized non-ferroelectric phases inside the film. This leads to a decreased $P_r$ value and hence limiting the maximum achievable memory window for certain ferroelectric material layer thickness increase.

Also, the write/read disturb becomes a challenge for the FeFET with integration into array structures, which leads to the consideration of special read/write schemes to avoid altering the memory state of unselected devices in the array. This, though, will increase the complexity of array operation.

SUMMARY

In an aspect of the disclosure, a structure comprises: a semiconductor-on-insulator substrate comprising a semiconductor material, a buried insulator layer under the semiconductor material and a substrate material under the semiconductor channel material; a ferroelectric capacitor under the buried insulator layer and which comprises a bottom electrode, a top electrode and a ferroelectric material between the bottom electrode and the top electrode; a gate stack over the semiconductor material; a first terminal contact connecting to the bottom electrode of the ferroelectric capacitor; and a second terminal contact connecting to the top electrode of the ferroelectric capacitor.

In an aspect of the disclosure, a structure comprises: a ferroelectric capacitor under a buried insulator material of semiconductor on insulator (SOI) technology; a field effect transistor (FET) isolated from the ferroelectric capacitor by at least the buried insulator material; and different contacts to a bottom electrode and top electrode of the ferroelectric capacitor and to the FET, wherein write and readout operations are decoupled between the ferroelectric capacitor and the FET, independent of an interface layer of a gate stack of the FET.

In an aspect of the disclosure, the structure comprises: a substrate material; a buried oxide layer on the substrate material; a semiconductor material on the buried oxide layer, the semiconductor material being representative of a channel region of a field effect transistor (FET); a ferroelectric capacitor integrated with the substrate material and underneath the buried oxide layer, the ferroelectric capacitor comprising a top electrode in contact with the buried oxide layer, a bottom electrode in contact with the substrate material and a ferroelectric material between the top electrode and the bottom electrode; a through via contact extending through the buried oxide layer and contacting the top electrode; a contact which electrically connects to the bottom electrode; a source contact which electrically connects to a source region of the FET; a drain contact which electrically connects to a drain region of the FET; and a gate contact which electrically connects to a gate electrode of the FET.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
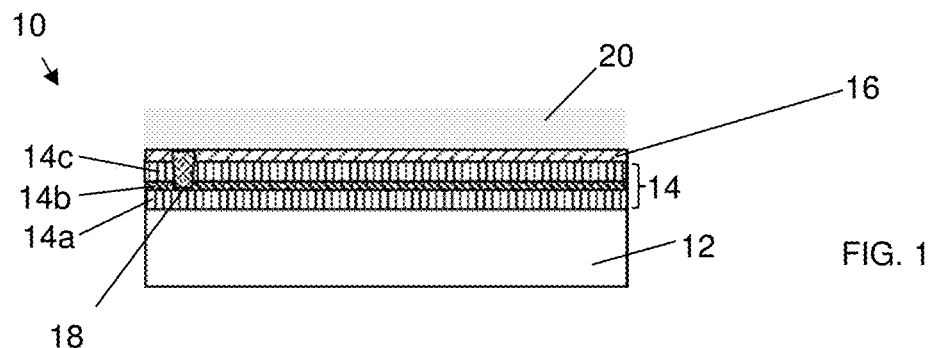
FIG. 1 shows a planar capacitor under a buried insulator layer, amongst other features, and respective fabrication processes in accordance with aspects of the present disclosure.

The present disclosure relates to semiconductor structures and, more particularly, to ferroelectric based transistors and methods of manufacture. More specifically, the present disclosure provides a ferroelectric based field effect transistors (FeFETs) for fully depleted silicon on insulator (FD-SOI) technology. Advantageously, the ferroelectric based transistors provide improved reliability due to the utilization of a metal-ferroelectric-metal (MFM) stack, while also providing improved flexibility by decoupling the dimensions of the MFM stack from the gate stack.

To overcome the above-mentioned challenges, the devices described herein are compatible with standard FD-SOI fabrication schemes. In these schemes, the substrate (e.g., Si) area underneath the buried oxide (BOX) is utilized to provide integration with ferroelectric material suitable for FRAM (or other memories) and FeFET based technologies. For example, in embodiments, the ferroelectric based transistors can be implemented in different devices such as, e.g., FeFET Memory Cell, eDRAM, and eFRAM, through buried ferroelectric capacitor structures underneath a buried oxide (BOX) of the FD-SOI, as well as a laminate stack of ferroelectric materials for the gate stack. As to the latter feature, the FD-SOI FeFET gate stack can have different gate stack configurations (e.g., Metal-Ferroelectric-Insulator-Semiconductor (MFIS), Metal-Ferroelectric-Metal-Insulator-Semiconductor (MFMIS), Metal Ferroelectric-Metal-Insulator-Ferroelectric-Insulator-Semiconductor (MFMFIS)) with the gate stack having a tailored area ratio.

In more specific embodiments, a MFM planar capacitor is integrated into the area underneath the BOX of SOI technology, where the ferroelectric material remnant polarization controls the surface potential of the semiconductor channel on top of the BOX. This, in turn, determines the $V_T$ shift associated with the main FD-SOI FET device to reflect the memory state stored in the capacitor. The integrated ferroelectric material can be any type of material that features reversible dipole switching response under the influence of an applied electrical field and characterized by ferroelectric material remnant polarization in absence of the applied electric field. An example of such ferroelectric materials includes binary oxide based high-k dielectric materials e.g., $HfO_2$, $ZrO_2$ with possible extrinsic dopant elements e.g. Si, Al, etc., to stabilize the ferroelectric material orthorhombic phase.

In more specific embodiments, an antiferroelectric (AFE) material can be utilized based on engineered top and bottom metal electrodes to provide a shifted hysteresis loop where a remnant polarization can be utilized to resemble the memory state. The top and bottom electrodes of the ferroelectric capacitor are contacted to write the memory state and control the dipole orientation independent of the FD-SOI FET device. In this way, it becomes possible to decouple write and readout operations between the capacitor and the FET, independent of an interface layer. In one variation, the source terminal is connected to the top electrode of the ferroelectric material capacitor; whereas, the bottom electrode is either connected to the drain or substrate terminal. The overall endurance of the FD-SOI based memory is therefore determined by the endurance capability of the MFM capacitor.

In still further variations of the device, the MFM capacitor is integrated alongside with ferroelectric material integration in the gate stack of the FD-SOI FET which provides dual ferroelectric material layer integration. The ferroelectric material layer integrated into the FD-SOI gate stack can take the form of MFMIS, MFIS, and MFS stack configurations. In these implementations, two ferroelectric material layers on top and underneath the BOX controls the Si surface potential leading to increased control over the channel and an effectively increased FD-SOI FeFET memory window size.

Other variation includes multiple (triple) ferroelectric material integration in form of a MFMFIS gate stack configuration in addition to MFM capacitor integration under the BOX area. The MFMIS and MFMFIS gate stack configurations can also feature tuned thickness and area ratio of the two capacitors (FE and FE/IL). The direct ferroelectric material layer thickness variations, as well as a laminate based ferroelectric material stack for the bottom and the top part of the FD-SOI FET are also varieties of the device.

In operation, the ferroelectric material underneath and on top of the BOX are written independently to provide a possible multi-bit data storage. The write scheme is adjusted to control the dipole orientation of the individual ferroelectric material layers to achieve tuned $V_T$ shift corresponding to multi-levels each resembling a combination of bit storage. The readout of the corresponding $V_T$ shift is achieved by measuring the drain current of the FD-SOI FET device and mapping it to a certain multibit binary state. Moreover, the write/readout of the memory states are decoupled to provide minimum disturb on the ferroelectric material state, e.g., the ferroelectric material state is written independently of the FD-SOI gate stack by applying write pulses to the ferroelectric material capacitor. In this configuration, the device readout is accomplished by sweeping the gate voltage of the normal dielectric stack and measuring the source-drain current.

The ferroelectric based transistors of the present disclosure can be manufactured in a number of ways using a number of different tools. In general, though, the methodologies and tools are used to form structures with dimensions in the micrometer and nanometer scale. The methodologies, i.e., technologies, employed to manufacture the ferroelectric based transistors of the present disclosure have been adopted from integrated circuit (IC) technology. For example, the structures are built on wafers and are realized in films of material patterned by photolithographic processes on the top of a wafer. In particular, the fabrication of the ferroelectric based transistors uses three basic building blocks: (i) deposition of thin films of material on a substrate, (ii) applying a patterned mask on top of the films by photolithographic imaging, and (iii) etching the films selectively to the mask.

FIG. 1 shows a planar capacitor under a buried insulator layer, amongst other features, and respective fabrication processes in accordance with aspects of the present disclosure. More specifically, the structure 10 includes a substrate 12. The substrate 12 can be composed of any suitable material including, but not limited to, Si, SiGe, SiGeC, SiC, GaAs, InAs, InP, and other III/V or II/VI compound semiconductors. A planar capacitor 14 is fabricated on the substrate 12. In embodiments, the planar capacitor 14 comprises a stack composed of a bottom electrode 14a, ferroelectric material 14b and a top electrode 14c (e.g., metal-ferroelectric-metal (MFM) capacitor).

The bottom electrode 14a and top electrode 14c are of a highly conductive material grown by various techniques e.g., deposition or sputtering of a metal layer. For example, the top electrode 14c and bottom electrode 14a can be titanium nitride. In further embodiments, the electrode material can be the same or different metal materials to achieve a built-in potential due to the difference in the selected metal work function. The top electrode 14c can be deposited by a low-temperature deposition technique; however, high-temperature deposition techniques can also be utilized.

The ferroelectric material 14b can be any type of material that features reversible dipole switching response under the influence of an applied electrical field (e.g., voltage) and which is further characterized by ferroelectric material remnant polarization in absence of the applied electric field. The remnant polarization of the ferroelectric material 14b can control the surface potential of a semiconductor channel, e.g., semiconductor material 20, on top of an insulator layer 16. This, in turn, determines the $V_T$ shift associated with a FD-SOI FET device to reflect a memory state stored in the capacitor 14. An example of ferroelectric material 14b includes binary oxide based high-k dielectric materials, e.g., $HfO_2$, $ZrO_2$, with optional extrinsic dopant elements e.g. Si, Al, etc., to stabilize the orthorhombic phase of the ferroelectric material. The ferroelectric material 14b can be grown by various techniques where an optional dopant element can be introduced to stabilize a certain crystallographic phase. The thickness of the two electrodes 14a, 14c, as well as the interlayer thickness of the ferroelectric material 14b, can be varied to match the target operation specification.

Following the deposition of the top electrode 14c, a dedicated anneal is provided to crystallize the ferroelectric material 14b either before the oxide layer growth, e.g., insulator layer 16, or at a later phase of the device integration. This dedicated anneal is designed to match an optimum crystallization anneal range specific to the integrated ferroelectric material 14b. Also, non-dedicated anneal steps intrinsic to the integration flow, e.g., source and drain dopant activation, are contemplated as a method to crystallize the ferroelectric material 14b.

Following the formation of the capacitor 14, an insulator layer 16 is deposited on top of the top electrode 14c to isolate the materials 14a, 14b, 14c of the capacitor 14 from the channel region of the device. In embodiments, the insulator layer 16 can be any suitable material including silicon oxide, sapphire, other suitable insulating materials, and/or combinations thereof. An exemplary insulator layer 16 is a buried oxide layer (BOX). The insulator layer 16 is formed by any suitable process, such as separation by implantation of oxygen (SIMOX), oxidation, deposition, and/or other suitable process.

Figure 4:
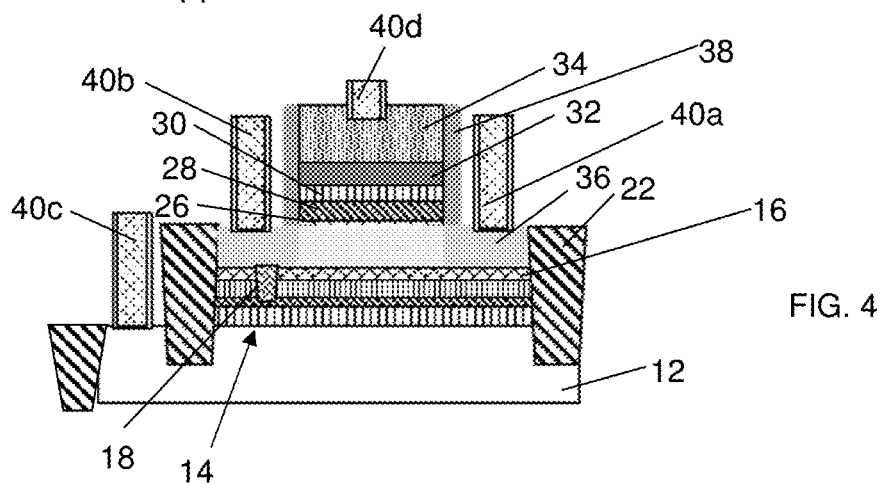
FIG. 4 shows contacts to the gate stack and source/drain regions, amongst other features, and respective fabrication processes in accordance with aspects of the present disclosure.

Still referring to FIG. 1, an optional through via contact 18 is formed through the insulator layer 16, which contacts the top electrode 14c of the capacitor 14. In embodiments, the contact 18 will be used to control and write the memory state, as an example. It should be understood by those of ordinary skill in the art, though, that the top electrode is preferably controlled by a source contact through the insulator layer 16 as further described herein. For example, although the via contact 18 is not the default due to the charge screening of ferroelectric polarization, it remains an option to include the via contact 18 for readout as shown in FIG. 4, for example. Accordingly, in the preferred embodiments, the writing is preferably performed through the source contact. Moreover, in the case that both source and drain terminal contacts are contacting the metal-ferroelectric-metal (MFM), the device then operates as a FRAM and not as FeFET, e.g. see FIG. 7.

The contact 18 can be formed by conventional lithography, etching and deposition methods known to those of skill in the art. For example, a resist formed over the insulator layer 16 is exposed to energy (light) to form a pattern (opening). An etching process with a selective chemistry, e.g., reactive ion etching (RIE), will be used to form a trench reaching to the top electrode 14c, through the openings of the resist. Following the resist removal by conventional oxygen ashing processes or other known stripants, conductive material can be deposited by any conventional deposition processes, e.g., CVD processes. Any residual material on the surface of the insulator layer 16 can be removed by conventional chemical mechanical polishing (CMP) processes.

A semiconductor material 20 is deposited on the insulator layer 16, effectively forming SOI technology. The semiconductor material 20 will be an active channel area of the device, e.g., FET, which can be composed of any suitable single crystalline material in a preferred crystallographic orientation (e.g., a (100), (110), (111), or (001) crystallographic orientation). Moreover, in embodiments, the semiconductor material 20 can be composed of the same or different materials than the substrate 12. The semiconductor material 20 can be fabricated using wafer bonding techniques or other suitable methods such as, e.g., channel layer growth where an epitaxial material is grown in the active channel over the insulator layer 16. The thickness of channel region, e.g., semiconductor material 20, and insulator layer 16 can be altered to match target performance specifications for the device.

Figure 2:
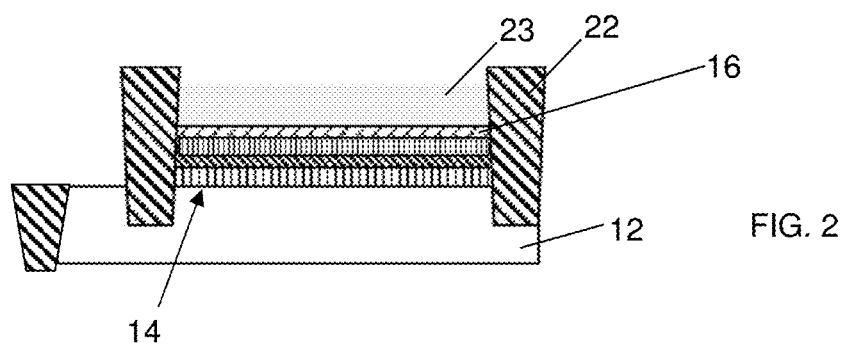
FIG. 2 shows trench isolation regions, amongst other features, and respective fabrication processes in accordance with aspects of the present disclosure.

FIG. 2 shows trench isolation regions 22, amongst other features, and respective fabrication processes. In embodiments, the trench isolation regions 22 are formed by conventional lithography, etching and deposition processes, as already described herein. The trench isolation regions 22 can be shallow trench isolation structures which define the channel region 23, e.g., composed of the semiconductor material 20, of a device. Specifically, the combination of the trench isolation regions 22 and the insulator layer 16 will effectively isolate the channel region 23 of the device.

FIG. 2 further shows the removal of the semiconductor material 20, insulator layer 16 and capacitor materials 14a, 14b, 14c, outside of the channel region 23. That is, through a selective etching process, these materials are removed to expose a surface of the semiconductor material 20. In this embodiment, the exposure of the semiconductor material 20 will allow contact terminals to apply a voltage to the bottom electrode 14a.

Figure 3:
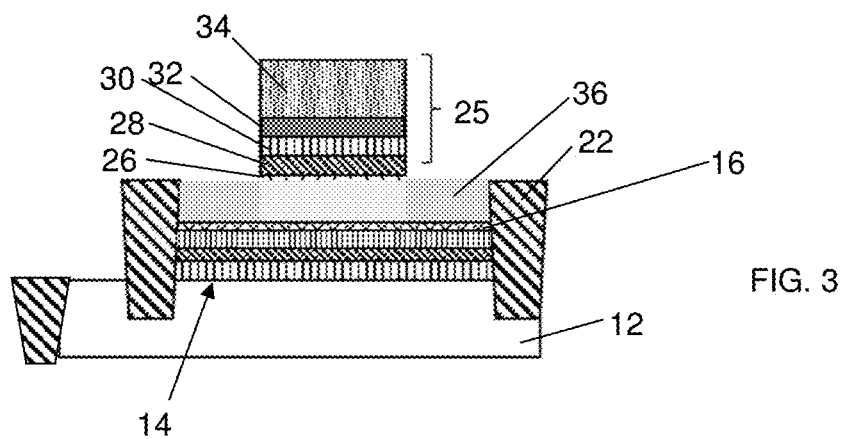
FIG. 3 shows a gate stack, amongst other features, and respective fabrication processes in accordance with aspects of the present disclosure.

FIG. 3 shows the deposition and patterning of gate stack material to form a gate stack 25 of a FD-SOI FET device. The FD-SOI FET device can be fabricated based on gate first or gate last integration schemes, where in a gate last scheme a dummy gate is utilized while source-drain dopant activation anneal precedes the actual gate deposition. On the other hand, as shown in FIGS. 3 and 4, for example, the gate first scheme features an actual gate stack deposition followed by a self-aligned source-drain ion implantation and subsequent implant activation anneal. Following the deposition of the gate materials, lithography and etching processes are performed to pattern these materials into the gate stack 25.

More specifically, the gate stack deposition is characterized by a growth of an optional interfacial layer 26 on top of the semiconductor material 20. The interfacial layer 26 is any type of dielectric material where a selection tradeoff may exist between the material bandgap parameter and permittivity. The interfacial layer 26 can be grown by various techniques, e.g., thermal growth or deposition, to achieve an interfacial layer thickness that matches a target operation specification. A layer of gate dielectric material 28 is deposited on the interfacial layer 26. In embodiments, the gate dielectric material 28 can be a high-k gate dielectric material, e.g., $HfO_2$, $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof, which is generally characterized by thickness and permittivity that is typically in a range higher than the dielectric material 26. The high-k dielectric material 28 can be optimized to exhibit ferroelectric properties under the influence of an applied electric field. An interface-less growth approach of this layer is also a possible alternative where the dielectric material 26 is omitted.

Still referring to FIG. 3, a metal layer 30, e.g., gate electrode, is deposited on the dielectric material 28. The metal layer 30 will act as a metal gate for the high-k dielectric layer and similarly as a capping metal for the target ferroelectric material. The properties of this metal layer 30, e.g. type, thickness, workfunction, can be adjusted to target device properties corresponding to n-type or p-type based FD-SOI FET devices. Examples of the workfunction materials for a p-channel FET include Ti, TiAlC, Al, TiAl, TaN, TaAlC, TiN, TiC and Co. Examples of the workfunction materials for an n-channel FET include TiN, TaN, TaAlC, TiC, TiAl, TaC, Co, Al, TiAl, HfTi, TiSi, TaSi or TiAlC. The workfunction materials may be formed by chemical vapor deposition (CVD), physical vapor deposition (PVD) including sputtering, atomic layer deposition (ALD) or other suitable method.

In embodiments, the metal layer 30 can induce a stress on the thin film of the high-k dielectric material 28 so that the stabilization of a specific ferroelectric material crystallographic phase is energetically favorable. The metal layer 30 can also be extended to function as a bottom electrode for subsequent layers of deposited ferroelectric materials. In this respect, the area of this metal layer 30 can be controlled to target certain performance advantages due to capacitor area ratio tuning within the stack structure. The metal layer 30 also acts as a floating metal gate where charge tunneling through the interface and storage into the floating gate is utilized to enable the bottom part of the FD-SOI stack to exhibit memory characteristics.

In optional embodiments, a ferroelectric material 32 can be used in the gate stack 25. The thickness as well as the type of the two ferroelectric material 32 can be altered to fit within certain flow thermal budgets for the subsequent process steps and target device performance. A top gate electrode 34 can be deposited as a cap layer for the ferroelectric material 32. The top gate electrode 34 can be composed of metal capping material over ferroelectric material 32, followed by highly conductive Si material, where the high conductivity is achieved with an extrinsic Si doping with high doping concentration corresponding to a n-type or p-type highly conductive layer. The properties of the top gate electrode 34 in terms of thickness, dopant concentration, and dopant type can be adjusted to match its utilization for either p-type or n-type based FD-SOI FET device.

In relation to the deposited gate stack materials, the gate stack etching is adjusted to structure the active gate area 25, while the area of source-drain is etched to Si substrate for possible source-drain implant steps. The number of etch steps and the order can be adjusted to etch the bottom and top part of the stack separately or in a single step in relation to the target stack configuration of the final device. Similarly, the order of source-drain ion implantation 36 as well as implant activation steps can be controlled in relation to the gate stack etching. The source ion implantation 36 will make contact with the contact 18.

In FIG. 4, sidewalls spacers 38 are formed on the gate stack 25. In embodiments, the sidewall spacers 38 are nitride material, deposited by a blanket deposition process, e.g., CVD, followed by an anisotropic etching process, leaving the material on the sidewalls of the gate stack 25. Contact terminals 40a, 40b, 40c, 40d are formed in contact with the drain and source regions 36, the exposed substrate 12 and the gate stack 25, e.g., gate electrode 34. The contact terminals 40a, 40b, 40c, 40d are formed by conventional lithography, etching and deposition methods such that no further explanation is required for a complete understanding of the present disclosure.

In embodiments, the contact terminal 40b will be used to apply a voltage to the top electrode 14c (through the contact 18); whereas, the contact terminal 40c will be used to apply a voltage to the bottom electrode 14a (through the substrate 12). In this way, the contact terminals 40b, 40c will be used to write data into a memory by switching the ferroelectric material 14b, e.g., switch the dipoles of the ferroelectric material 14b as described in more detail below. The contact terminal 40b will also apply a voltage to the channel region of the gate stack 25.

Figure 5:
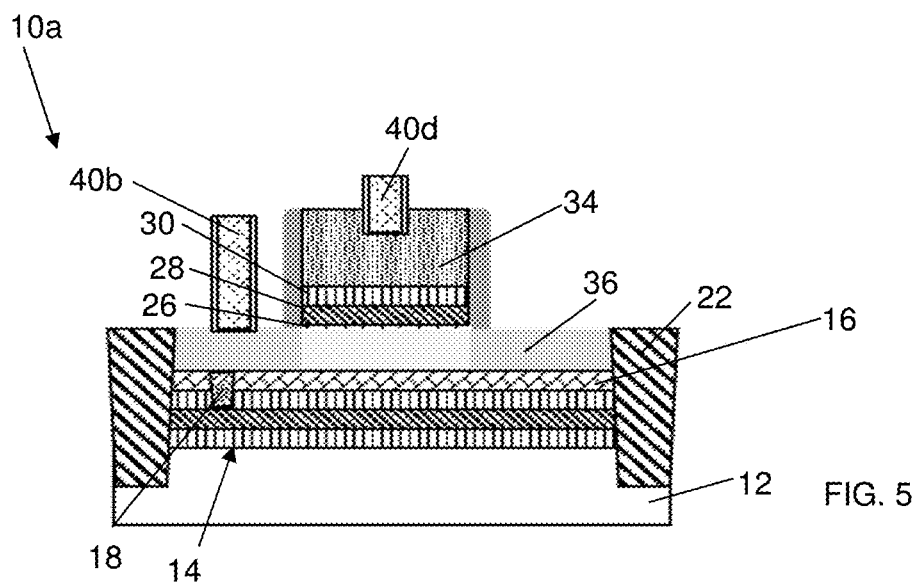
FIG. 5 shows a device comprising two contact terminals, amongst other features, and respective fabrication processes in accordance with aspects of the present disclosure.

FIG. 5 shows a device 10a comprising two contact terminals 40b, 40d. In this device 10a, the contact terminal 40b provides an applied voltage to both the source region and the top electrode 14c of the capacitor 14. Accordingly, writing is through the field across the buried oxide 16, S/D as top contacts, and the substrate 12 as bottom metal electrode (MFM contact); although the via contact 18 can still be used for readout as an option as noted already herein. The remaining features are the same as that described with reference to FIGS. 1-4.

Figure 6:
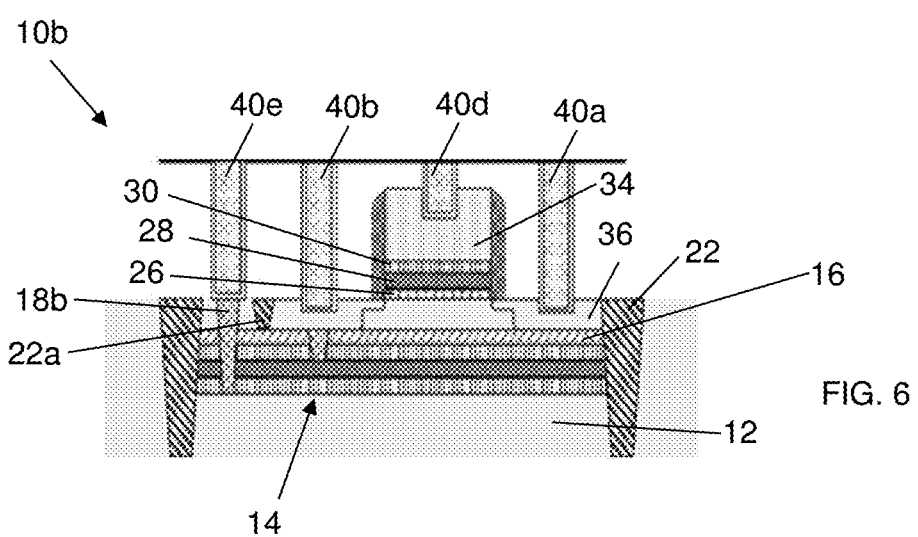
FIG. 6 shows a device comprising three contact terminals, amongst other features, and respective fabrication processes in accordance with aspects of the present disclosure.

FIG. 6 shows a device 10b comprising three contact terminals 40b, 40d, 40e and contact 18b which extends from the contact terminal 40e to the bottom electrode 14a of the capacitor 14. In this way, the contact terminal 40e can directly apply a voltage to the bottom electrode 14a; compared to the voltage being applied through the substrate 12 shown in FIG. 4. A shallow trench isolation 22a is also provided. The remaining features are the same as that described with reference to FIGS. 1-4.

Figure 7:
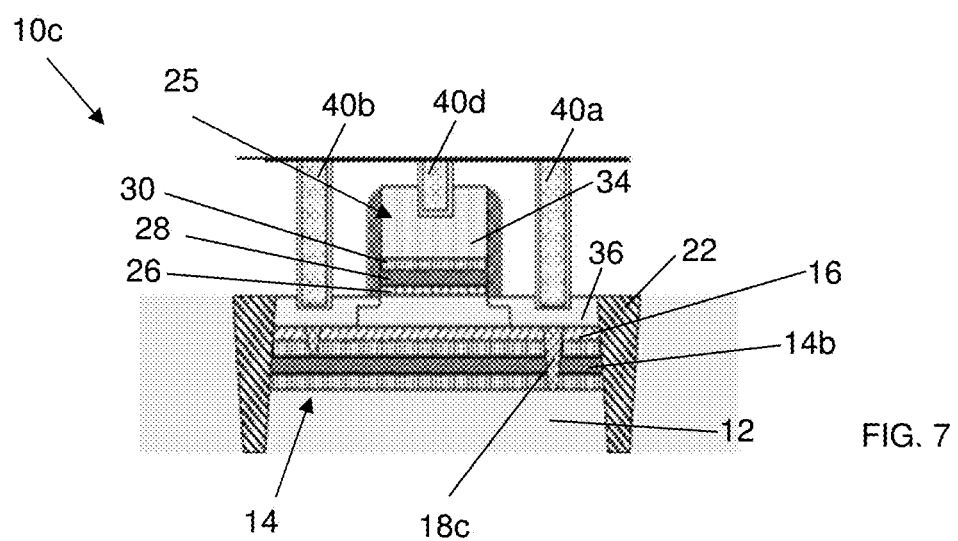
FIG. 7 shows another device comprising three contact terminals, amongst other features, and respective fabrication processes in accordance with aspects of the present disclosure.

FIG. 7 shows a device 10c comprising three contact terminals 40a, 40b, 40d and contact 18c. The gate stack 25 can be a MFIS stack structure based FD-SOI FeFET, and is mainly used to operate as a FRAM device. In this device 10c, the contact 18c is on the drain side of the device and extends through the semiconductor material 20 to the bottom electrode 14a of the capacitor 14. In this way, the source side contact terminal 40b can provide an applied voltage to the top electrode 14c and the drain side contact terminal 40a can provide an applied voltage to the bottom electrode 14a. Moreover, in this configuration, the readout current between the source and drain becomes proportional to the polarization charges switching of the buried MFM, with the writing of the MFM performed through the via contacts 18, 18c. The remaining features are the same as that described with reference to FIGS. 1-4.

Figure 8:
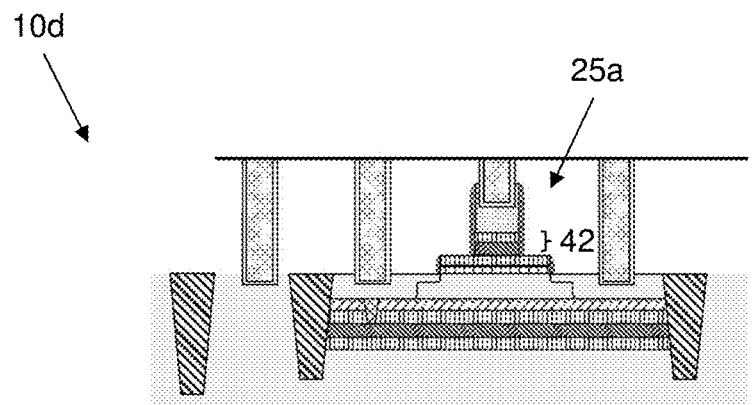
FIGS. 8-10 show devices comprising four contact terminals, amongst other features, and respective fabrication processes in accordance with aspects of the present disclosure.
Figure 9:
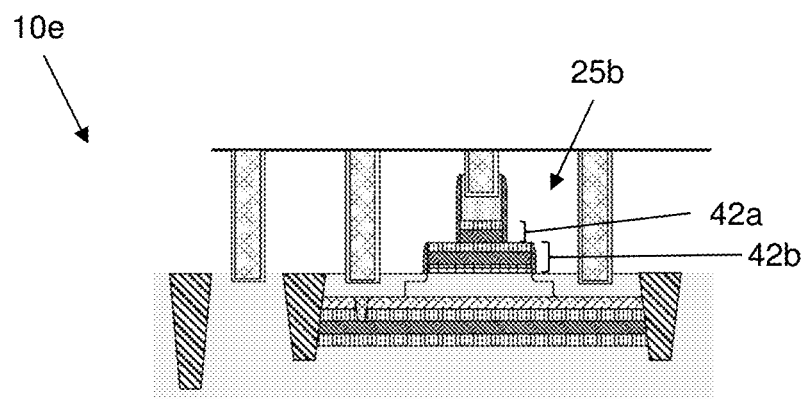
Figure 10:
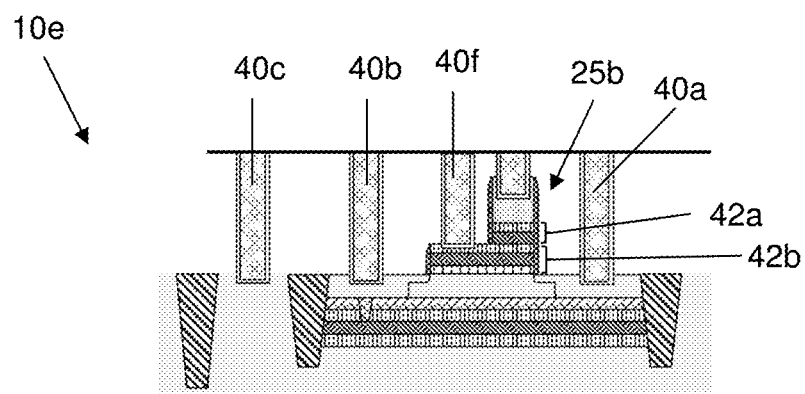

FIGS. 8-10 show devices with four terminals, e.g., FeFET memory, which have write and readout operations. As shown in each of these devices 10d, 10e, 10f, the bottom electrode 14a of the capacitor 14 is connected to the contact 18 (e.g., though via contact) by the source contact terminal 40b and the bottom electrode 14a is contacted via the substrate contact terminal 40c. In addition to the capacitor 14, the gate stack 25a of FIG. 8 comprises a single ferroelectric stack (e.g., MFM stack) 42 (similar to the optional device described with respect to FIG. 4); whereas, the devices 10e, 10f comprise a dual ferroelectric stack 42a, 42b. In this way, (i) the device 10d of FIG. 8 is a MFMIS stack configuration with tailored MFM to MIS area ratio, (ii) the device 10e of FIG. 9 is a MFMFIS based structure with tailored area ratio for dual ferroelectric stack integration, and (iii) the device 10e of FIG. 10 is a MFMFIS structure with dual ferroelectric integration, tailored area ratio, and further comprising an electrode contact 40f connecting to the bottom MFM stack 42b and the electrode contact 40d connecting to the top MFM stack 42a.

As in other embodiments with ferroelectric materials for the capacitor and the gate stack, in the device 10e of FIG. 10, for example, polarization of the ferroelectric material 14b of the capacitor 14 can be adjusted in order to change backbias operating point by the polarization field. Advantageously, in normal operation no backbias voltage needs to be applied, which provides an additional reduction of power consumption. Also, the back bias of the ferroelectric material can be adjusted by program or erase operations on the back-gate. And, a top wordline will control the ferroelectric material of the gate stack and the readout; whereas, the backgate wordline will control the ferroelectric material 14b of the capacitor 14. Accordingly, as with other embodiments, there is an independent switching of different ferroelectric materials.

Figure 11:
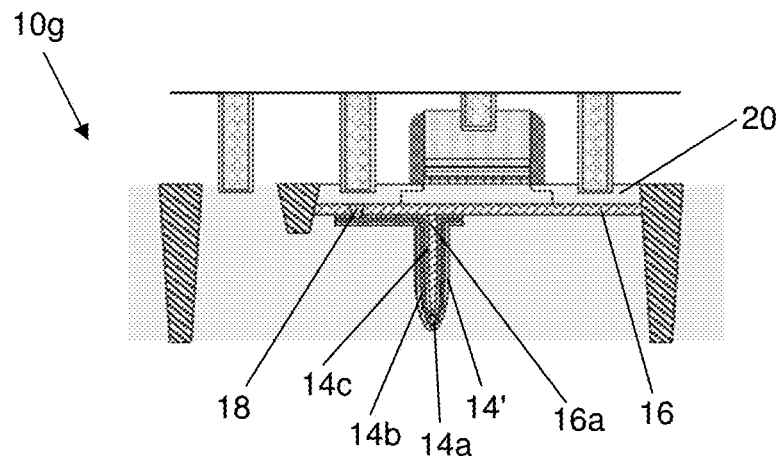
FIGS. 11-13 show devices utilizing one or more deep trench metal-ferroelectric-meta (MFM) capacitors, amongst other features, and respective fabrication processes in accordance with aspects of the present disclosure.
Figure 12:
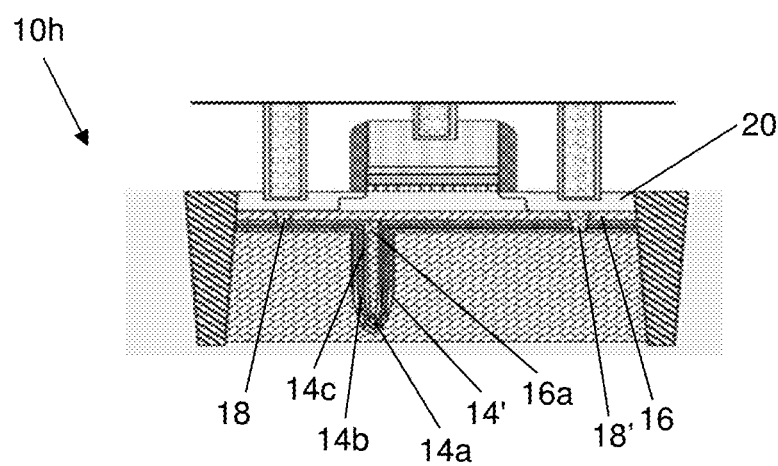
Figure 13:
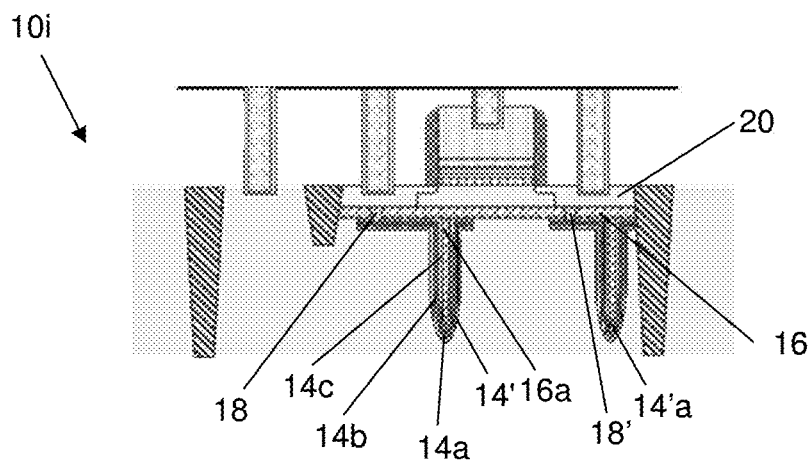

FIGS. 11-13 show devices, e.g., FeFET memory, utilizing one or more deep trench MFM capacitors 14'. In these embodiments, the deep trench MFM capacitors 14' feature a high aspect ratio deep etch profile inside the Si substrate/oxide to provide an intrinsic high remnant polarization for the ferroelectric material capacitor. The dipole orientation of the ferroelectric material 14b is controlled through pulses at the two electrode terminals of the capacitor. The ferroelectric material memory state is readout by reversing the ferroelectric material dipole state and measuring the corresponding switching current. In another variation of the device, multiple deep trenches of ferroelectric material capacitors are connected in a parallel configuration to provide maximized ferroelectric material remnant polarization.

More specifically, the devices 10g, 10h shown in FIGS. 11 and 12, respectively, show a single deep trench MFM capacitor 14' integrated in the area under the insulator layer 16 (BOX); whereas, FIG. 13 shows a structure 10i utilizing multiple deep trench MFM capacitors 14', 14'a. Similar to that already described, the deep trench capacitors 14', 14'a comprise a bottom electrode 14a, a ferroelectric material 14b and a top electrode 14c. An insulator layer 16a is also provided within the deep trench to fill the remaining area, which can be deposited in the same deposition process as the insulator layer 16.

In each of the embodiments of FIGS. 11-13, the top electrode 14c of the capacitor 14' is connected by the source terminal 40b of the FD-SOI FET using the contact 18 (e.g., through oxide via). As shown in FIG. FIG. 13, the drain terminal, e.g., contact 18', can be utilized to contact the additional MFM capacitor 14'a. In the structure 10i of FIG. 13, the additional capacitor 14'a will extend the lifetime of the device operation by allowing switching between the different available capacitors 14', 14'a. In the devices 10g and 10i, the bottom electrode 14a of the capacitor 14' can be contacted through the substrate terminal 40c; whereas, in FIG. 12, the bottom electrode 14a of the capacitor 14' can be connected through the drain terminal 18'. As previously described, the memory state readout is achieved by switching the capacitor dipole state and measuring the source-drain current.

Figure 14:
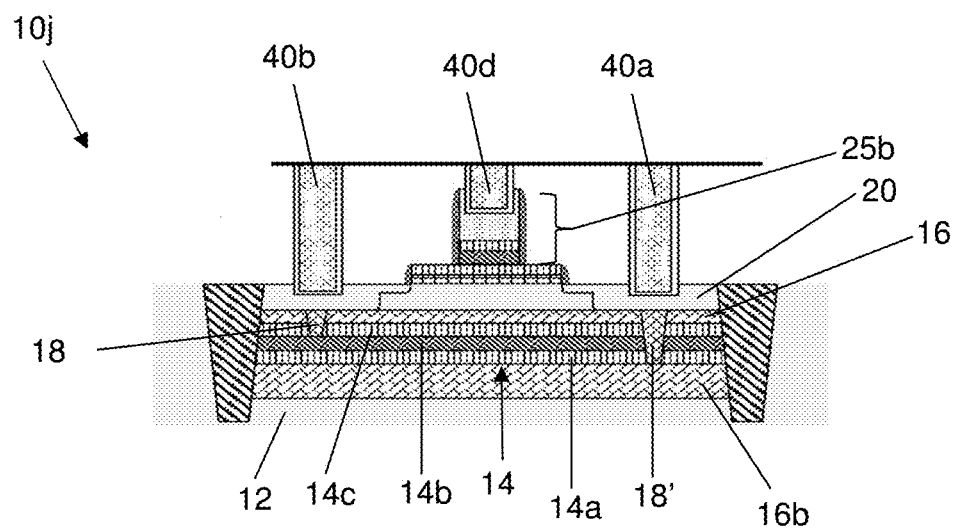
FIGS. 14 and 15 show devices with three contact terminals and a MFMFIS stacked gate configuration, amongst other features, and respective fabrication processes in accordance with aspects of the present disclosure.
Figure 15:
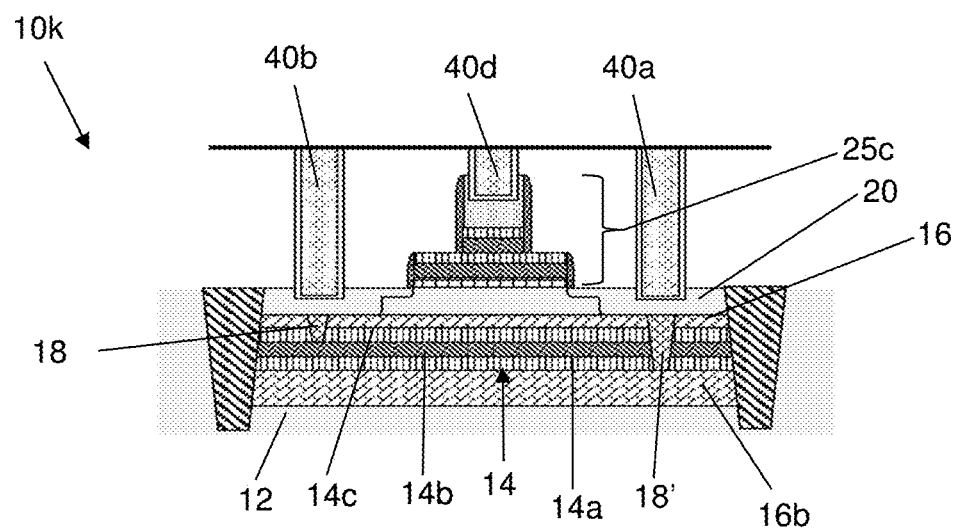

FIGS. 14 and 15 show devices with three terminals to operate mainly as a FRAM device, which have write and readout operations. In embodiments, the device 10j comprises a MFMIS stacked configuration 25b (e.g., single ferroelectric layer integration) with a tailored MFM to MIS area ratio; whereas, the device 10k comprises a MFMFIS stacked configuration 25c, (e.g., layered ferroelectric layer stack integration) with a tailored area ratio for dual ferroelectric stack integration. Moreover, as shown in each of these devices 10j, 10k, an additional buried insulator layer 16b (e.g., oxide material) is introduced under the capacitor 14 to isolate the capacitor 14 from the substrate 12. As a result, the capacitor is completely isolated from both the substrate 12 and semiconductor material 20 (e.g., channel region).

In these implementations, the top electrode 14c and bottom electrodes 14a of the capacitor 14 are connected to contacts 18, 18', respectively, with utilization of the source and drain terminal contacts 40a, 40b. In these devices 10j, 10k, the memory state readout is achieved by sweeping the gate voltage with a bias voltage applied to the drain terminal contact 40a and measuring the source to drain current. That is, the readout current between the source and drain becomes proportional to the polarization charges switching the buried MFM, e.g., writing the MFM is done through the via contacts 18. 18. The extracted $V_T$ from the $I_d$-$V_g$ characteristic resembles the state stored in the ferroelectric layers. Also, the reversible dipole switching provides the sense current for readout of the memory state as similar to FRAM or DRAM memory.

Moreover and still referring to FIGS. 14 and 15, the area ratio of the capacitors of the gate structures 25b, 25c can be tuned to achieve a stack voltage distribution in favor of ferroelectric switching and enabling the device operation at lower write voltages. The ferroelectric layers in the gate stacks 25b, 25c can be switched by applying a write pulse to the gate terminal 40d while the source terminals 40b and drain terminals 40a are biased to a reference voltage. Moreover, the thickness and type of ferroelectric materials in the capacitor 14 and gate stacks 25b, 25c can be tuned to match target performance specification. In addition, the multi-ferroelectric layer integration enables device operation in different modes between multilevel with large memory window (MW) FD-SOI FeFET to an extended endurance mode.

Figure 16:
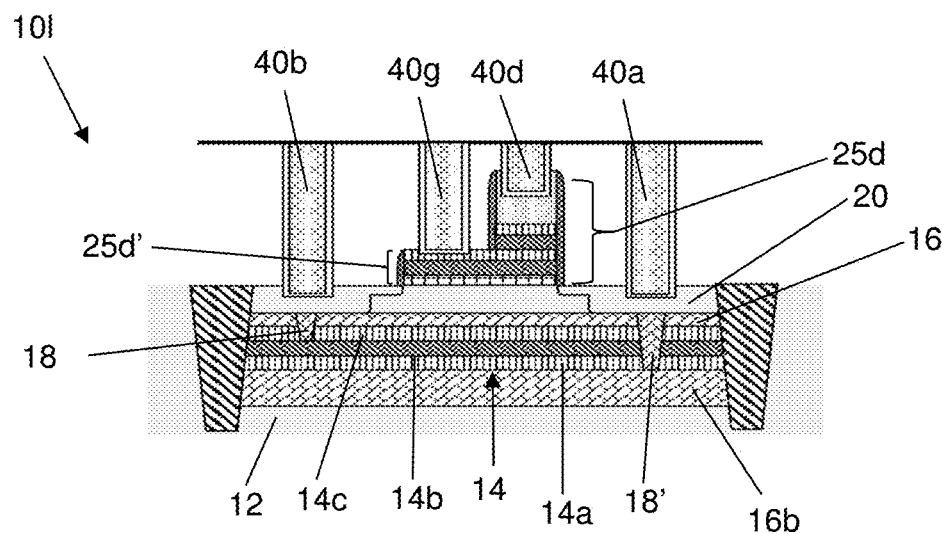
FIG. 16 shows a device with four contact terminals and a tailored gate structure, amongst other features, and respective fabrication processes in accordance with aspects of the present disclosure.

FIG. 16 shows a device 10l with four terminals and a tailored gate structure 25d, which can also mainly operate as a FRAM device. More specifically, the device 10l of FIG. 16 is representative of a MFMFIS structure with dual ferroelectric integration having a tailored area ratio. In this configuration, the electrode 48 of the bottom capacitor 25d' is connected separately through contact 40g to independently control the switching of each layer of the dual layer stack 25d. In operation, the memory state readout is achieved by applying a voltage to the bottom electrode 14a with a bias voltage applied to the drain terminal and measuring the source to drain current. The extracted $V_T$ from the $I_d$-$V_g$ characteristic resembles the state stored in the ferroelectric layers.

Figure 17:
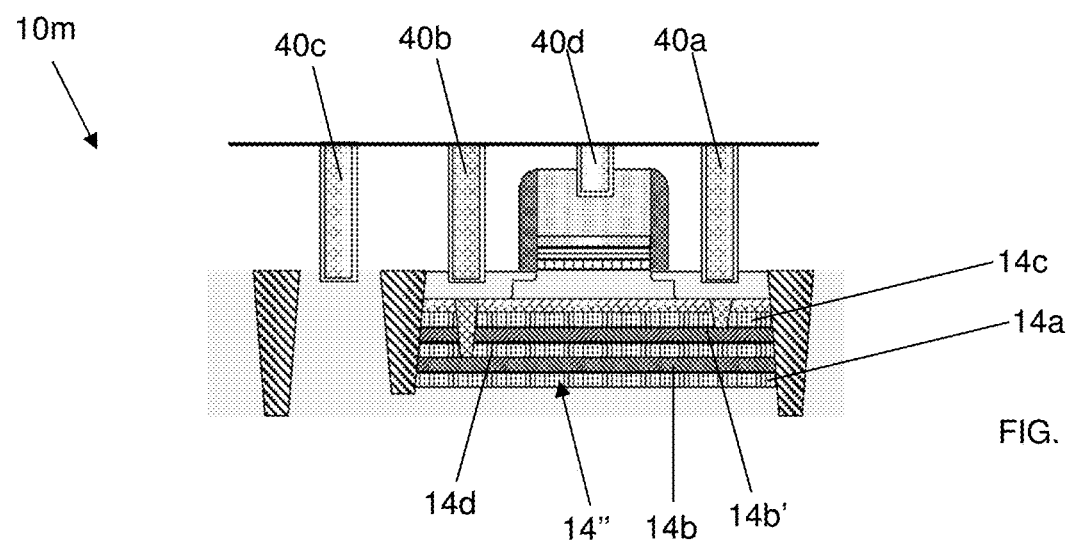
FIGS. 17-19 show devices characterized by capacitors comprising multilayers of ferroelectric material, amongst other features, and respective fabrication processes in accordance with aspects of the present disclosure.
Figure 18:
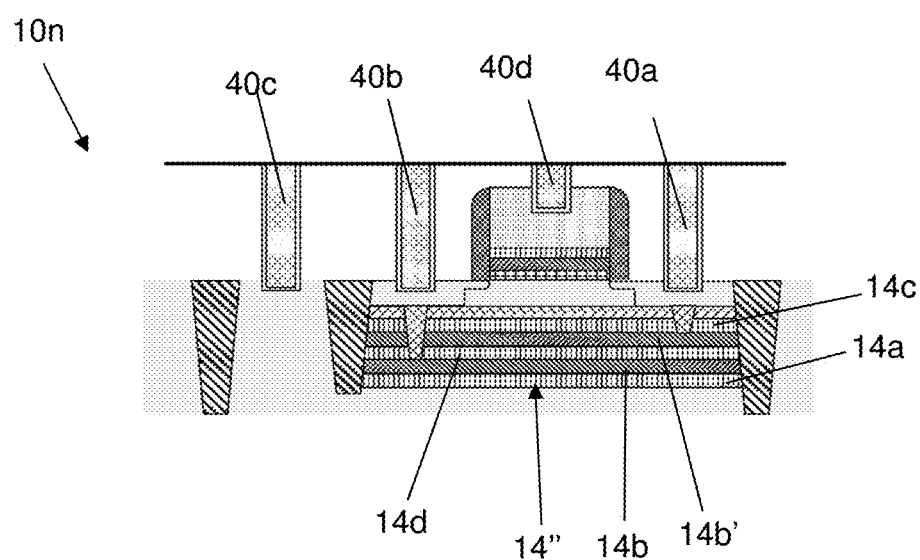
Figure 19:
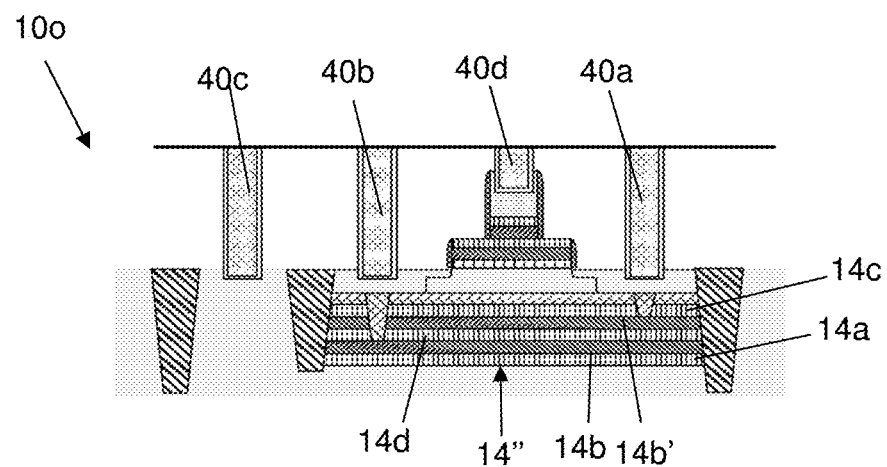

FIGS. 17-19 show devices 10m 10n, 10o, e.g., FeFET memory, with capacitors 14" comprising multilayers of ferroelectric material (e.g., MFIFM stack capacitor integration) under the buried insulator layer 16. More specifically, the device 10m of FIG. 17 represents a MIS FD-SOI FET with high-k dielectric integration, where an inner metal is replaced by thin insulating layer 14d (e.g., 0.5 nm to 1.0 nm) of e.g. $Al_2O_3$ or $SiO_2$. In this configuration, the write operation can be done through 40c and source/drain terminals 40a/40b terminals. The device 10n of FIG. 18 represents a MFIS stack structure with ferroelectric material integration, and the device 10o of FIG. 19 represents a dual ferroelectric layer gate stack integration with an MFMFIS configuration and tailored area ratio. Accordingly, the devices 10m 10n, 10o can have a single or multilayered ferroelectric stack in the gate stack.

The multilayers of ferroelectric material provide the ability to enhance the ferroelectric film granularity which reduces the ferroelectric variability thereby enabling a reliable multilevel cell operation. For example, the devices 10m 10n, 10o provide a multi-bit memory storage where the ferroelectric write operation is tuned to provide a controlled $V_T$ shift corresponding to different bit storage due to the large memory window (MW) associated with the multilayer-structured device.

The multilayers of ferroelectric material is achieved by integration of a MFIFM stack structure where a common middle electrode 14d can optionally be utilized to switch the state of the top and bottom ferroelectric layers 14b, 14b'. Also, in each of these devices 10m 10n, 10o, the top electrode and bottom electrode are connected with a through via contact while the bottom electrode is contacted by the substrate contact terminal 40c. This provides the possibility to individually write the state of each ferroelectric layer independently and hence the associated control of the $V_T$ shift that can correspond to multi-bit storage. Also, in this configuration, the write operation will be through the entire stack in absence of a floating electrode.

Moreover, as described above, the gate stacks shown in the devices 10m 10n, 10o can be structured in the range between normal dielectric to a single or dual ferroelectric material integration. The area ratio and thickness of the integrated layers in the stack can be tuned to achieve target performance specifications. In a multi-bit operation mode, the columnar interruption of grain growth allows for higher number of grains enabling multilevel switching upon varying the write pulse amplitude between substrate terminal contact 40c and source/drain contacts (e.g., contacts 40b, 40a).

An applied pulse to the top and bottom electrodes with similar polarity results in dipole orientations that are opposite in direction and hence corresponding to a diminished internal field and no effect on the channel surface potential. On the other hand, an applied pulse of opposite polarity results in a maximized $V_T$ shifts corresponding to a larger memory window (MW). In addition, asymmetric pulse amplitudes, as well as a gradually incrementing pulse amplitudes, are possible options to realize the multilevel storage. Also, in FIGS. 17-19, writing the buried MFM capacitor is done through the buried oxide, and as should be understood by those of skill in the art the source and drain contacts can be omitted in the case of a FeFET and used in the case of FRAM devices.

As should now be understood with respect to each of the devices shown in FIGS. 4-10, it is possible to contact both the top electrode 14c and the bottom electrode 14a of the capacitor 14 to achieve a low voltage operation, as well as achieving a high endurance FeFET. The top electrode 14c of the capacitor 14 is mainly contacted by the source terminal, e.g., contact terminal 40b of the FD-SOI FET. Hence, the source terminal of the FD-SOI FET has a dual operation function, by default as a current source during readout and additionally as a write terminal of the memory state. On the other hand, the bottom electrode 14a of the capacitor 14 can be contacted using different mechanisms, either through the substrate contact 40c shown in FIG. 4, with an extra through via terminal, e.g., contact terminal 40e, shown in FIG. 6, or with a drain via contact, e.g., contact 18c, shown in FIG. 7. In addition, in any of these embodiments, as described with respect to FIGS. 1-4 it is an option to have an integrated MFM capacitor within the gate stack 25.

Read and Write Operations

The devices of FIGS. 4-19 provide both read and write operations. Generally speaking, in operation, the bottom and top electrodes of the MFM capacitor are contacted to control and write the memory state. The write voltage is expected to be lower than the standard FeFET, determined by $E_c^* d_F$ where $E_c$ and $d_F$ are the coercive field and thickness of the ferroelectric material, respectively. A characteristic of the device is the independence of write voltage from the buffer interfacial layer 26 between the ferroelectric material layer and semiconductor material 20. The write voltage for the device becomes directly proportional to the ferroelectric material thickness scaling, thereby accommodating the possibility for scaled ferroelectric material layer thickness to achieve memory operation with lower write voltage. In another variation, the ferroelectric material layer is engineered for a reduced coercive field and/or field necessary for saturated polarization switching by material engineering to achieve a low voltage switching ferroelectric material capacitor.

More specifically, the following is a description of the write and read operations:

Write Operation:

The memory state of the FD-SOI FeFET is achieved by pulses applied to the MFM capacitor 14 between the two electrode terminals 14a, 14c of the capacitor 14 and corresponding to either program (PG) or erase (ER) operation. In this respect, the other terminals of the FD-SOI FeFET device are left in floating conditions. The PG pulse is expected to have positive amplitude resulting in dipole switching and an associated FE positive remnant polarization. Similarly, the ER pulse has an opposite polarity and expected to switch the dipoles in opposite direction resulting in a negative remnant polarization.

Similarly, the ferroelectric material layer in the gate stack 25 can be switched by applying a write pulse to the gate terminal and with reference to the other device terminals. Hence, the device terminals (e.g., source, drain, and bulk) are biased to a reference voltage, e.g., 0V; whereas, PG/ER pulses with positive/negative amplitudes are applied to the gate terminal. The PG/ER pulse amplitude, shape, and duration are adjusted to match optimum operation specifications for the FE integrated layers.

Readout Operation:

The memory state readout is achieved by sweeping the gate terminal voltage ($V_g$), while a bias voltage is applied to the drain terminal, and measuring the current ($I_d$) between the source-drain terminals. The $I_d$-$V_g$ characteristic, as well as the device $V_T$ shift, becomes dependent on the memory state stored on each of the FE integrated layers. The substrate terminal of the devices FIGS. 4 and 6 is biased to reference voltage while certain bias voltage can be utilized to control the operating memory window of the device. In the device 10c of FIG. 7, the substrate bulk terminal is omitted and the readout is considered with a floating substrate terminal.

Flow Charts Showing Additional Fabrication Processes

Figure 20:
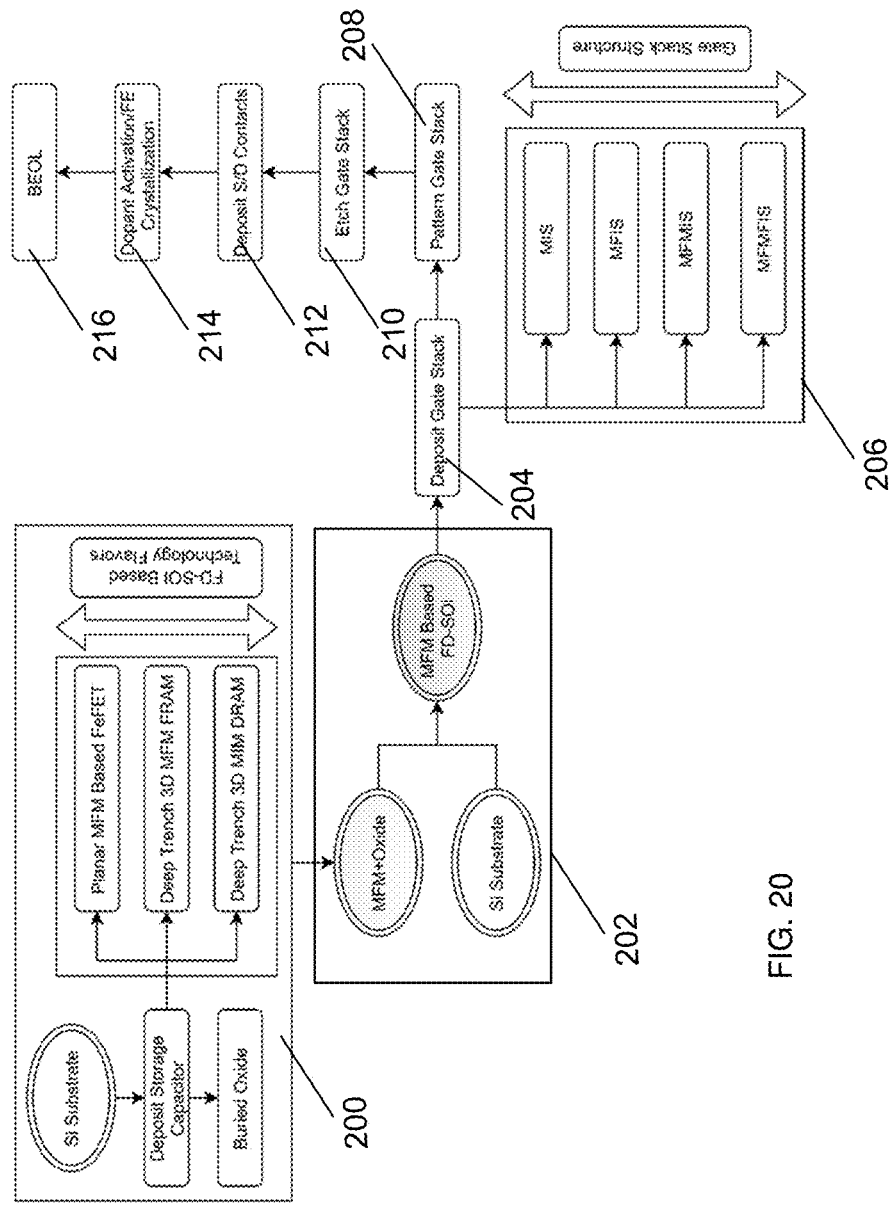
FIGS. 20 and 21 show flow charts depicting various fabrication processes in accordance with aspects of the present disclosure.
Figure 21:
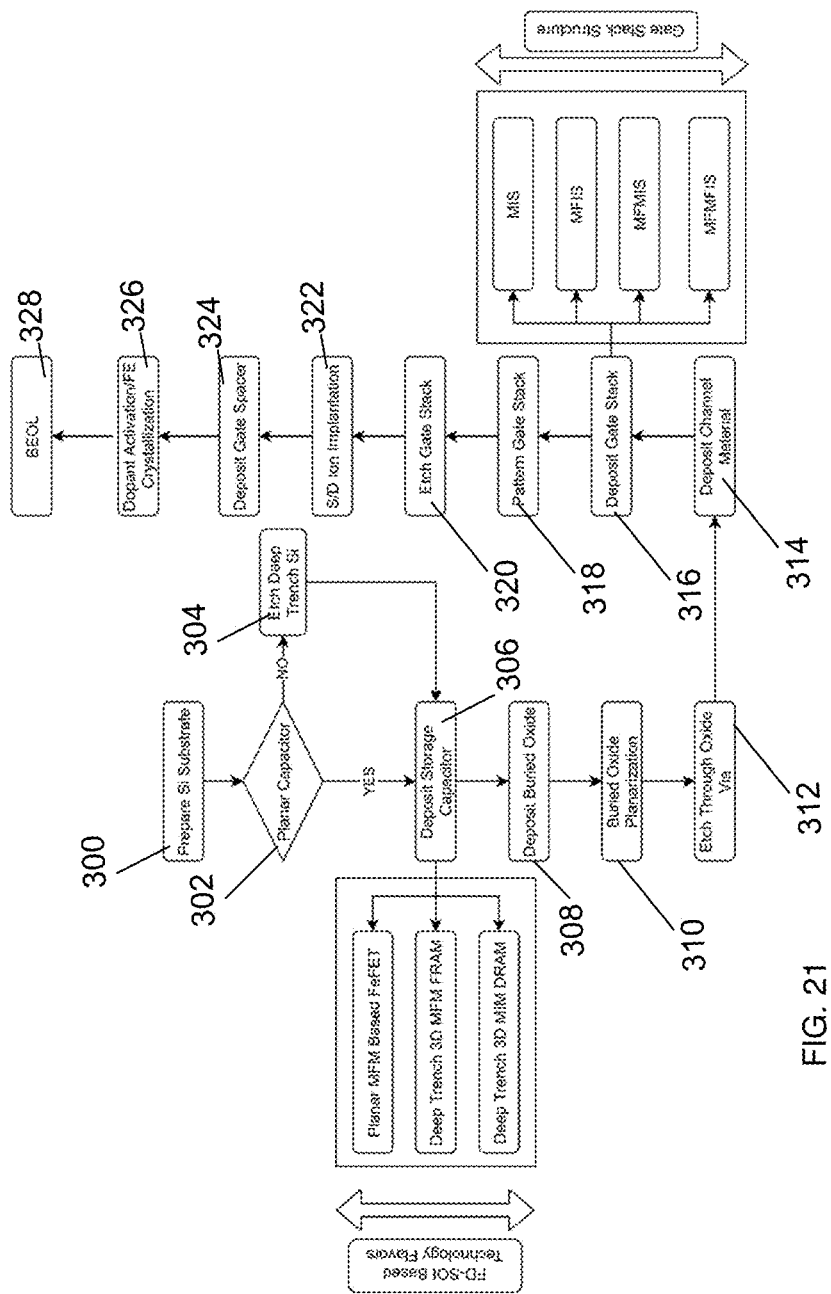

FIGS. 20 and 21 show flow charts depicting various fabrication processes in accordance with aspects of the present disclosure. More specifically, in FIG. 20, step 200 generally shows a fabrication process of the different capacitors. For example, different MFM capacitors can be formed on the substrate based on: (i) a FeFET, e.g., planar MFM based FeFET, (ii) a FRAM, e.g., deep trench 3D MFM FRAM, and (iii) a MIM DRAM, e.g., deep trench 3D DRAM. In these configurations, the insulator layer (BOX) and wafer should be pre-patterned. As represented at step 202, the MFM and oxide material in combination with the substrate material will be used to form an MFM based FD-SOI.

As further shown at step 204, a gate stack can be deposited on the substrate. The gate stack can include the following material configurations as shown at step 206: (i) MIS, (ii) MFIS, (iii) MFMIS, and (iv) MFMFIS, wherein "M" is a metal electrode, "F" is a ferroelectric material, "I" is an insulator material and "S" is a semiconductor material. These different materials can be deposited by conventional deposition methods, e.g., CVD, as is known to those of skill in the art. Following the deposition of the gate materials, at step 208, the gate stack can be patterned, at step 210, the gate stack can be etched and, at step 212, the source and drain contacts can be formed, as described herein. At step 214, the structure can undergo dopant activation and ferroelectric material crystallization. At step 216, back end of line (BEOL) features are formed, as is known in the art.

FIG. 21 shows more details of the fabrication processes in accordance with aspects of the present disclosure. For example, at step 300, the substrate is prepared. At step 302, a decision is made as to whether the capacitor is to be a planar capacitor. If not to be planar, at step 304, a trench is formed by conventional lithography and etching processes. At step 306, the capacitor material is deposited as either in a planar configuration or within the trench. In embodiments, the capacitors can be, e.g., (i) a planar MFM based on a FeFET design. (ii) a deep trench MFM based on a FRAM design or (iii) a deep trench MIM based on a DRAM design. These different materials can be deposited by conventional deposition methods, e.g., CVD, as is known to those of skill in the art.

Following the formation of the capacitor, the buried oxide material can be deposited at step 308. At step 310, the buried oxide can be planarized, followed by an etching process to form an oxide via at step 312. At step 314, a channel material is deposited and, at step 316, a gate stack is deposited as already described with respect to FIG. 20.

Following the deposition of the gate materials, at step 318, the gate stack can be patterned. At step 320, the gate stack can be etched and, at step 322, the source and drain can be formed through ion implantation processes as known in the art such that no further explanation is required herein for a complete understanding of the present disclosure. At step 324, spacer material can be deposited and patterned on the side of the formed gate stack. contacts can be formed, as already described herein. At step 326, the structure can undergo dopant activation and ferroelectric material crystallization. At step 328, back end of line (BEOL) features are formed, as is known in the art.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a semiconductor-on insulator substrate comprising a semiconductor channel material, a buried insulator layer under the semiconductor material and a substrate material under the semiconductor channel material;
   a ferroelectric capacitor under the buried insulator layer and which comprises a stack of materials comprising a bottom electrode, a top electrode and a ferroelectric material between the bottom electrode and the top electrode;
   an insulator layer on the top electrode;
   a gate stack comprising a channel region over the insulator layer;
   shallow trench isolation regions extending into the substate material and in combination with the insulator layer isolate the channel region of the gate stack;
   a first terminal contact connecting to the bottom electrode of the ferroelectric capacitor; and
   a second terminal contact connecting to the top electrode of the ferroelectric capacitor.

2. The structure of claim 1, wherein the ferroelectric material is a binary oxide based high-k dielectric material.

3. The structure of claim 2, wherein the binary oxide based high-k dielectric material includes extrinsic dopant elements.

4. The structure of claim 1, wherein the ferroelectric material has a remnant polarization which controls a surface potential of the semiconductor material.

5. The structure of claim 1, wherein the first terminal contact is a combination of a source terminal contact and a through via contact underneath a source region of the gate stack on the semiconductor material and extending through the buried insulator layer to contact with the top electrode.

6. The structure of claim 5, wherein the second terminal contact is a substrate terminal in contact with the substrate material.

7. The structure of claim 5, wherein the second terminal contact is a through via contact extending through the semiconductor material, the buried insulator layer, the top electrode and the ferroelectric material to contact with the bottom electrode.

8. The structure of claim 5, further comprising a via terminal contact through only the insulator layer and contacting the top electrode.

9. The structure of claim 1, wherein the ferroelectric capacitor includes at least one additional ferroelectric material and a middle electrode, the middle electrode is between the additional ferroelectric material and the ferroelectric material.

10. The structure of claim 1, wherein the gate stack is a Metal-Ferroelectric-Insulator-Semiconductor (MFIS) gate stack, a Metal-Ferroelectric-Metal-Insulator-Semiconductor (MFMIS) gate stack, or a Metal Ferroelectric-Metal-Insulator-Ferroelectric-Insulator-Semiconductor (MFMFIS) gate stack.

11. The structure of claim 1, wherein the gate stack includes two metal-ferroelectric-metal structure each of which has its own gate terminal.

12. The structure of claim 1, wherein the ferroelectric capacitor is at least one ferroelectric deep trench capacitor integrated in the substrate material and under the buried insulator layer.

13. The structure of claim 1, further comprising an insulator layer between the substrate material and the ferroelectric capacitor.

14. A structure comprising:
    a ferroelectric capacitor under a buried insulator material of semiconductor on insulator (SOI) technology, the ferroelectric capacitor comprising a stack of materials comprising a bottom electrode, a top electrode and a ferroelectric material between the bottom electrode and the top electrode;
    a field effect transistor (FET) comprising a channel region isolated from the ferroelectric capacitor by shallow trench isolation regions extending into a substate material under the buried insulator material and an insulator layer over the top electrode; and
    different contacts to the bottom electrode and the top electrode of the ferroelectric capacitor and to the FET, wherein write and readout operations are decoupled between the ferroelectric capacitor and the FET, independent of an interface layer of a gate stack of the FET.

15. The structure of claim 14, wherein the ferroelectric capacitor includes a ferroelectric material between the top electrode and a middle electrode and between the middle electrode and the bottom electrode.

16. The structure of claim 14, wherein the ferroelectric capacitor is at least one deep trench the ferroelectric capacitor within a substrate of the SOI technology and under the burred insulator material.

17. The structure of claim 14, wherein the FET comprises a Metal-Ferroelectric-Metal-Insulator-Semiconductor (MFIS) gate stack, a Metal-Ferroelectric-Metal-Insulator-Semiconductor (MFMIS) gate stack, or a Metal Ferroelectric-Metal-Insulator-Ferroelectric-Insulator-Semiconductor (MFMFIS) gate stack.

18. The structure of claim 14, further comprising an insulator layer underneath the ferroelectric capacitor.

19. A structure, comprising:
    a substrate material;
    a buried oxide layer on the substrate material;
    a semiconductor material on the buried oxide layer, the semiconductor material being representative of a channel region of a field effect transistor (FET);
    a ferroelectric capacitor integrated with the substrate material and underneath the buried oxide layer, the ferroelectric capacitor comprising stack of materials comprising a top electrode in contact with the buried oxide layer, a bottom electrode in contact with the substrate material and a ferroelectric material between the top electrode and the bottom electrode;
    shallow trench isolation regions extending into the substate material and in combination with an insulator layer above the ferroelectric capacitor define the ferroelectric capacitor and isolate the channel region of the gate stack from the ferroelectric capacitor;
    a through via contact extending through the buried oxide layer and contacting the top electrode;
    a contact which electrically connects to the bottom electrode;
    a source contact which electrically connects to a source region of the FET;
    a drain contact which electrically connects to a drain region of the FET; and
    a gate contact which electrically connects to a gate electrode of the FET.

20. The structure of claim 19, wherein the contact which electrically connects to the bottom electrode is a through via contact on either drain side or a source side of the FET.

* * * * *